United States Patent [19]
Johnson

[11] Patent Number: 5,645,433
[45] Date of Patent: Jul. 8, 1997

[54] CONTACTING SYSTEM FOR ELECTRICAL DEVICES

[75] Inventor: David A. Johnson, St. Louis Park, Minn.

[73] Assignee: JohnsTech International Corporation, Minneapolis, Minn.

[21] Appl. No.: 240,021

[22] Filed: May 9, 1994

[51] Int. Cl.$^6$ .................................................. H01R 9/09
[52] U.S. Cl. .............................................. 439/66; 439/74
[58] Field of Search ............................. 439/66, 91, 74, 439/246, 248, 75, 252

[56] References Cited

U.S. PATENT DOCUMENTS

| | | | |
|---|---|---|---|
| 3,551,750 | 12/1970 | Sterling | 317/101 |
| 4,064,623 | 12/1977 | Moore | 439/91 X |
| 4,118,090 | 10/1978 | Del Mei | 339/12 R |
| 4,240,198 | 12/1980 | Alonso | 439/91 X |
| 4,295,700 | 10/1981 | Sado | 339/61 M |
| 4,330,165 | 5/1982 | Sado | 339/59 M |

(List continued on next page.)

FOREIGN PATENT DOCUMENTS

| | | | |
|---|---|---|---|
| 0 245 787 | 11/1987 | European Pat. Off. | G01R 1/067 |
| 31 36 896 | 4/1983 | Germany | G01R 31/02 |
| 2189657 | 4/1986 | United Kingdom | G01R 1/073 |

OTHER PUBLICATIONS

"Fuzz Button® Board Assembly", brochure by Tecknit Interconnection Products.
"Probe Construction Affects Test Performance", by Terry Mawby, *Test & Measurement World*, Aug. 1989, p. 61–70 (Missing pp. 63, 65, 67 and 69).
"The Importance of the Spring Contact Probe in ATE" by Ron Robison, Reprinted from Jun. 1984 *Test & Measurement World*, ©1984 Interfield Publishing Company, Inc., pp. 1–6.
"Probing Designs for the Future", insert by Everett/Charles Contact Products.
"Close Center Testing", insert by Everett/Charles Contact products.
Brochure by ©Ostby–Barton Test Probes 1987, 1988, 1989, 1990.
Insert by Burndy.
"P.G.A. Testing & Burn–In"0 brochure by Yamaichi.
"Design Notes for A ZIF Pin Array System" by David S. Goodman et al., *Connection Technology*, Mar. 1985, p. 25–27.
"Advanced Packaging C4 Technology" by Chris Fergen, *Outlook*, 1st Quarter 1994, pp. 135–138.
"Can You Find Reliability in a Plastic Pin Grid Array?" by Virginia F. Wells, Advanced Technology Department, Indy Electronics Inc., Manteca, CA; *Semiconductor International*, pp. 214–218, May 1989.

*Primary Examiner*—Neil Abrams
*Assistant Examiner*—Daniel Wittels
*Attorney, Agent, or Firm*—Nawrocki, Rooney & Sivertson, P.A.

[57] ABSTRACT

A connector for electrically interconnecting a lead of a device to a terminal spaced at a distance from the lead. The apparatus includes a conductive element comprising a first contact, a shoulder, and a second contact. The first contact is attached to the shoulder and extends upward therefrom, and the second contact is attached to the shoulder and extends downward therefrom. The first contact is electrically coupled to the lead of the device when the lead of the device is brought into engagement with the first contact. The second contact is electrically coupled to the terminal. A support member is positioned below the shoulder of the conductive element and an elastomeric material is positioned between the shoulder of the conductive element and the support member. The elastomeric material resiliently biases the conductive element in an original position. When a downward force is applied to the conductive element, however, the elastomeric material may be overcome thereby allowing the conductive element to move in a downward direction in response to the downward force. The elastomeric material returns the conductive element to the original position when the downward force is removed.

43 Claims, 4 Drawing Sheets

U.S. PATENT DOCUMENTS

| | | | |
|---|---|---|---|
| 4,397,519 | 8/1983 | Cooney | 339/255 R |
| 4,402,562 | 9/1983 | Sado | 339/61 M |
| 4,445,735 | 5/1984 | Bonnefoy | 339/17 M |
| 4,477,774 | 10/1984 | Revirieux | 324/158 P |
| 4,506,938 | 3/1985 | Madden | 339/17 CF |
| 4,509,099 | 4/1985 | Takamatsu et al. | 361/413 |
| 4,511,197 | 4/1985 | Grabbe et al. | 339/17 CF |
| 4,593,961 | 6/1986 | Cosmo | 339/61 M |
| 4,598,246 | 7/1986 | Staples et al. | 324/73 PC |
| 4,633,175 | 12/1986 | Ritchie et al. | 324/158 F |
| 4,634,199 | 1/1987 | Anhalt et al. | 339/17 M |
| 4,664,458 | 5/1987 | Worth | 339/17 M |
| 4,686,467 | 8/1987 | DeLapp et al. | 324/158 F |
| 4,793,814 | 12/1988 | Zifcak et al. | 439/66 |
| 4,800,335 | 1/1989 | Davila et al. | 324/158 F |
| 4,866,374 | 9/1989 | Cedrone | 324/158 F |
| 4,870,353 | 9/1989 | Cook | 324/158 F |
| 4,950,980 | 8/1990 | Pfaff | 439/296 |
| 4,998,886 | 3/1991 | Werner | 439/66 |
| 5,069,629 | 12/1991 | Johnson | 439/71 |
| 5,137,456 | 8/1992 | Desai et al. | 439/66 OR |
| 5,139,427 | 8/1992 | Boyd et al. | 439/66 |
| 5,207,584 | 5/1993 | Johnson | 439/66 |
| 5,254,834 | 10/1993 | Johnson | 219/121.72 |
| 5,336,094 | 8/1994 | Johnson | 439/62 |
| 5,360,348 | 11/1994 | Johnson | 439/72 |
| 5,385,477 | 1/1995 | Vaynkof et al. | 439/66 OR |
| 5,388,996 | 2/1995 | Johnson | 439/65 |

CONTACTING SYSTEM FOR ELECTRICAL DEVICES

TECHNICAL FIELD

The present invention deals broadly with the field of electrical interconnect systems. More narrowly, however, the invention is related to technology, for example, for interconnecting the leads of an integrated circuit device with corresponding terminals on a printed circuit board interfacing with a tester intended to effect test analysis of the integrated circuit device. The preferred embodiment of the invention is directed to contacts and means for mounting the contacts for effecting such interconnection.

BACKGROUND OF THE INVENTION

A plethora of applications exist for effecting electrical contact between two conductors. One significant application is effecting interconnection between the leads of an integrated circuit device and conductive pads or terminals on a printed circuit board which serves to effect an interfacing between the integrated circuit (IC) device and a tester apparatus. Such apparatus are used to evaluate performance of integrated circuit devices.

Numerous considerations bear upon the structure employed to interconnect the IC and the printed circuit board. These factors include both electrical and mechanical considerations. For typical interconnection systems, special attention must be given to the electrical performance including self inductance and capacitance, the life span requirements, the repairability or replacability, the operation temperature environment, the coplanarity of the device terminals, the mechanical manufacturing limitations, and the device alignment and orientation of the device terminals relative to the interconnection system.

In a typical semi-conductor production facility, each integrated circuit is tested using a tester apparatus. The tester apparatus may be connected to an interconnection system wherein the leads of an integrated circuit are connected to a PC board within the interconnection system. The PC board may then be controlled by the tester apparatus for testing the integrated circuit.

The tester apparatus may test the functionality and performance of an integrated circuit through the interconnection system. Due to manufacturing process variations, a portion of the integrated circuits may perform at a higher level than other integrated circuits. Therefore, the tester apparatus may be used to sort the devices according to their performance characteristics. This is termed "speed grading". Typically, the higher performance integrated circuits will receive a premium price in the market place. It can readily be seen that it is important that the interconnection system not distort the performance characteristics of the integrated circuit under test. If it does, a substantial amount of revenue may be lost by the integrated circuit manufacturer.

A main objective of an interconnection system is to maintain a "non-distorting electrical interconnection" between the tester apparatus and the integrated circuit as discussed above. To accomplish this, it is a goal of an interconnection system to have low lead inductance/resistance, low lead-to-lead capacitance, low lead-to-ground capacitance, and a high electrical decoupling factor. These characteristics all reduce the "distorting" nature of the electrical interconnection system.

Another main objective of the interconnection system is to maintain a consistent and reliable electrical interconnection over many test cycles. In conventional interconnection systems, the contact resistance of the interconnection system may change after continued use. A main cause of this resistance change may be solder buildup on the tips of the contacts within the interconnection system. Increased contact resistance can distort the performance of the integrated circuit and thus reduce the test yield realized.

Because of tolerances in the manufacturing process, all of the leads of a semiconductor package may not be coplanar. For similar reasons, contacts of the interconnection system itself may not be fully coplanar. Therefore, when the integrated circuit and the interconnection system are brought into engagement, some of the leads of the integrated circuit package may not be adequately contacted to corresponding contacts within the interconnection system. It is a goal of the interconnection system to compensate for these non-coplanarities.

To accomplish this, the interconnection system may comprise movable interconnection contact elements such that the first integrated circuit package leads may contact and depress a corresponding contact in the interconnection system until the remaining package leads come into engagement with a corresponding contact. An advantage of this arrangement is that the movable contact elements may allow each semiconductor lead to have a force applied thereon which falls within an acceptable range to establish a gas-tight connection, despite the non-coplanarity of the semiconductor package and interconnection system.

One prior art structure which seeks to accomplish the purpose of the present invention is a pogo-pin configuration. A pogo-pin configuration typically consists of a contact tip, a shaft, a barrel, and a spring. The shaft is enclosed within the barrel and biased by the spring to an upward position. Located at the upper tip of the shaft is the contact tip for contacting the lead of a semiconductor package. The shaft generally makes electrical contact with the barrel, and the lower portion of the barrel is connected to a PC board. As a semiconductor package lead comes into contact with the contact tip, the spring allows the shaft to depress downward into the barrel while still maintaining electrical contact with the barrel. The semiconductor package is forced down on the pogo-pins until all of the semiconductor package leads have an appropriate force thereon.

Although the pogo-pin configuration solves some of the problems discussed above, the leads are generally long and therefore inject a substantial amount of inductance into the interconnection system. Because of this relatively high level of inductance, the pogo-pin configuration may generally be limited to medium to low speed applications.

Another prior art structure which seeks to accomplish the purpose of the present invention is known as the Yamaichi contact. This type of contact includes an inverted L-shaped support having a cantilevered contacting portion mounted at the distal end of the generally horizontal leg of the inverted, L-shaped support, and extending generally parallel to that leg. The distal end of the contacting portion is upwardly turned so that a point thereof is engageable by a lead of an integrated circuit device to be contacted. The support, in turn, is engaged in some manner with or through a pad or terminal portion of a printed circuit board. Problems that have been observed with the Yamaichi contact include solder buildup, difficulty of construction, and high inductance. In addition, the Yamaichi contact relies on the flexure of the contact material.

Another type of structure which seeks to accomplish the purpose of the present invention is a fuzz button contact. A fuzz button contact typically consists of a specially designed array of resilient knitted wire mesh which is retained within a housing that is mounted to a PC board. The lead of a semiconductor package may be received by the housing, wherein the wire mesh forms a connection therewith. The fuzz button contact allows for some degree of compression which helps compensate for the non-coplanarity of the semiconductor package and the interconnection system. Due to the close contact of the wire mesh, a low resistance/ inductance connection can be realized between the PC board and a lead of the semiconductor device. Typical problems which may exist for the fuzz button contact include the loss of compliance of the wire mesh after continued use. Furthermore, the wires within the wire mesh may become fatigued and eventually break. Finally, the wire mesh may become undesirably deformed, particularly if the fuzz button is over compressed. All of these problems limit the reliability and life expectancy of the fuzz button contact configuration.

Another prior art structure which seeks to accomplish the purpose of the present invention is a wire contact. A wire contact consists of a contact wire which is held in place by a housing. A first end of the contact wire is in contact with a PC board. A second end of the contact wire is in contact with a lead of a semiconductor package. As the lead of the semiconductor package is forced down upon the second end of the contact wire, the center portion of the contact wire is bent in a lateral direction. The properties of the contact wire may be selected to provide the desired stiffness and deflection force.

It is to these dictates and shortcomings of the prior art that the present invention is directed. It is an improved electrical interconnecting system which addresses the dictates of the prior art and resolves problems thereof.

SUMMARY OF THE INVENTION

The present invention overcomes the disadvantages found in the prior art by providing an interconnection system having a generally rigid pin assembly which maximizes both the life expectancy and performance characteristics of the interconnection system.

The present invention functions to electrically interconnect a lead of an integrated circuit device to a terminal, for example, of a printed circuit board, spaced at a distance from the corresponding lead of the integrated circuit. The assembly includes a housing which is interposed between the lead of the integrated circuit and the corresponding spaced terminal. In one embodiment of the present invention, the housing has a through-hole through which a first contact element extends. The upper end of the first contact element may be contacted by a lead of a semiconductor package. A counter-bore hole, which may have a diameter larger than the through-hole, may extend from the back surface of the housing into the housing wall a predetermined distance. A shoulder may be provided on the first contact element. The shoulder may be received by the counter-bore hole and may have a diameter that is greater than the through-hole. A second contact element may be connected to the shoulder and may extend downward therefrom.

A PC board may be used to connect the second contact element to a tester apparatus. The PC board may have a via therethrough for receiving the lower portion of the second contact element. The via may have a conductive coating placed on an inner surface thereof such that the lower portion of the second contact may electrically contact the inner surface of the via. The coating on the inner surface of the via may then be electrically connected through a PC trace on the PC board to the tester apparatus.

In one embodiment of the present invention, the counter-bore hole may be deep enough to receive only the shoulder. In this embodiment, a sheet of an elastomeric material may be placed between the housing and the PC board. The sheet of elastomeric material may have holes therein for allowing the second contact element of each pin assembly to pass therethrough and contact the inner surface of a corresponding via in the PC board.

In another embodiment of the present invention, the via in the PC board may have a diameter that is less than the diameter of the counter-bore hole and shoulder. In addition, the counter-bore hole may be deep enough to receive both the shoulder and an elastomeric element. The elastomeric element or sleeve, in one embodiment, may be disposed between the shoulder and the upper surface of the PC board. The elastomeric element may have a hole therein for receiving the second contact element.

Force applied to the first contact element by the lead of a semiconductor package is transmitted to the shoulder. The shoulder transmits the force to the elastomeric material. The elastomeric material is deformed, thereby allowing the first contact element, the shoulder, and the second contact element to become depressed toward the PC board. The characteristics of the elastomeric material may be selected for a wide variety of depression force characteristics.

In one embodiment of the present invention, the first contact element may extend beyond the upper surface of the housing. In this embodiment, a semiconductor package lead may contact the first contact element at a predetermined distance from the housing surface. In another embodiment of the present invention, a self-alignment counter-bore may extend from the upper surface of the housing down to a depth that does not intersect the counter-bore hole discussed above which extends from the lower surface of the housing and receives the shoulder. The upper end of the first contact element may extend into the self-alignment counter-bore hole. In this configuration, the self-alignment counter-bore holes may provide a mechanism for self-aligning the leads of a semiconductor chip with the first contact elements.

Several embodiments of the present invention help ensure that an acceptable electrical connection is made between the second contact element and the inner surface of the via. In one embodiment of the present invention, the second contact element may be bent to provide a biasing force between the second contact element and the inner surface of the via. Although the second contact element may contact the entire circumference of the inner surface of the via, it is a preferred mode of the present invention to only contact one side of the inner surface of the via. In this way, the second contact element may "scrub" or "wipe" the inner surface of the via as the elastomeric material allows the second contact element to move up and down. This scrubbing action reduces the potential for high contact or inconsistent contact resistance due to possible contamination on the contacting surfaces, thus providing a longer lasting electrical interconnection.

In another embodiment of the present invention, the self-aligning counter sink hole may be off center from the first contact element. That is, the self-aligning counter sink hole may be non-coaxial with the first contact element. In this configuration, the lead of the semiconductor package (e.g. Ball Grid Array package) will be self aligned with the self alignment counter sink hole and therefore off center from the first contact element. This provides a lateral force component to the first contact element which urges the shoulder and the second contact element laterally. The force can be enhanced by offsetting the shoulder with respect to the first and second contact elements, thereby shortening the length of one side of the shoulder. This causes the second contact element to be forced against one side of the inner surface of the via.

In another embodiment of the present invention, a via insert may be placed within the via of the PC board. The via insert may have a hole therethrough wherein the hole is at an angle relative to the axis of the pin assembly. As the first contact element, shoulder, and second contact element are forced downward, the second contact element engages one side of the angled wall of the via insert.

Another embodiment of the present invention provides an offset of the elastomeric material from the first and second contact elements. The elastomeric material may be offset in one direction only, radially from a point on the housing, or randomly. Other configurations of having the elastomeric material offset from the corresponding pin assembly are contemplated and are considered to be within the scope of the present invention.

Another embodiment of the present invention provides a counter-bore hole in the PC board for receiving the second contact element. This counter-bore hole may replace the via discussed above. An advantage of having a counter-bore hole in the PC board rather than a via is that the counter-bore hole frees up a number of routing layers in the PC board. This allows better decoupling between signals on the PC board and also allows more signals to be routed on the PC board.

Finally, it is recognized that the present invention may be used with a Pin Grid Array (PGA) package, a Ball Grid Array (BGA) package, a DIP package, or any other type of semiconductor package or circuit-board to circuit interconnection means. In addition, it is recognized that the present invention does not require a PC board. Rather, any means for connecting the pin assembly to a tester apparatus is considered to be within the scope of the present invention.

The present invention is thus an electrical contact interconnecting system improved over systems of the prior art. More specific features and advantages obtained in view of those features will become apparent with reference to the DETAILED DESCRIPTION OF THE INVENTION, appended claims, and accompanying drawing figures.

DETAILED DESCRIPTION OF THE INVENTION

Figure 1:
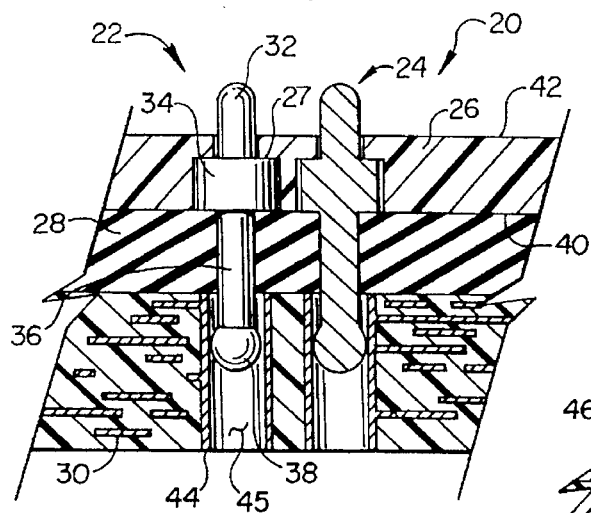
FIG. 1 is an enlarged fragmentary sectional view of a first embodiment of the present invention.

Referring now to the drawings wherein like reference numerals denote like elements throughout the several views, FIG. 1 generally illustrates a contacting system 20 of a first embodiment of the present invention and more specifically shows a first pin assembly 22, a second pin assembly 24, a housing 26, an elastomer sheet 28, and a Printed Circuit (PC) board 30. Although only a first pin assembly 22 and a second pin assembly 24 are shown, the present invention contemplates that any number of pin assemblies may be incorporated into the present invention.

The pin assembly 22 comprises a first contact element 32, a shoulder 34, and a second contact element 36. A lower end of the first contact element 32 is integrally formed with an upper portion of the shoulder 34. An upper end of the second contact element 36 is integrally formed with a lower portion of the shoulder 34. A lower end of the second contact assembly 36 may comprise an enlarged sphere 38. It is recognized that the enlarged sphere 38 may be any shape and is not limited to a spherical shape as shown. It is also recognized that the pin assembly does not have to be what is commonly thought of as a "pin". Rather, the pin assembly may be a conductive element having any shape and still be within the scope of the present invention.

The housing 26, elastomer sheet 28, and PC board 30 have a passthrough hole with a diameter extending therethrough along a common axis such that the pin assembly 22 may be received by the passthrough hole. The housing 26 may have a counter-bore hole 27 with a diameter equal to or larger than the diameter of the passthrough hole wherein the counter-bore hole 27 extends from a lower surface 40 of the housing 26 into the housing for a predetermined distance. The diameter of the counter-bore hole 27 may be large enough to accommodate the shoulder 34 of the pin assembly 22. In this configuration, the shoulder 34 of the pin assembly 22 is secured within the contacting system via the housing 26 on the upper and side surfaces and by the sheet of elastomer on the lower surface. When a force is applied to the pin assembly 22 in a downward direction, the shoulder 34 produces force on the elastomer sheet 28 thereby compressing the elastomer sheet 28. Therefore, the pin assembly 22 is movable in a downward direction in response to a downward force applied to the pin assembly 22.

Figure 2:
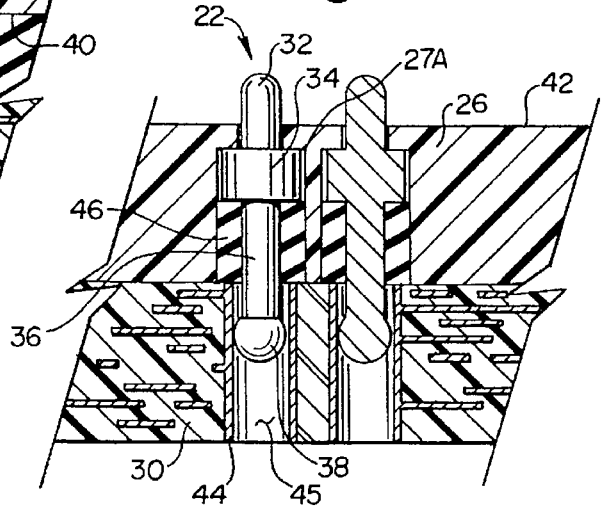
FIG. 2 is an enlarged fragmentary sectional view of a second embodiment of the present invention.

In the embodiments shown in FIGS. 1 and 2, the first contact element 32 extends a predetermined distance above an upper surface 42 of housing 26. In the embodiments shown in FIGS. 1–4, the second contacting element 38 extends through the elastomer and may extend a predetermined distance into the passthrough hole in the PC board 30. The passthrough hole in the PC board 30 is called a via 45. The via 45 has an inner surface which may be coated with a conductive coating 44 such that the enlarged sphere 38 at the lower end of the second contacting element 26 may make an electrical connection therewith. The conductive coating 44 on the inner surface of the via 45 may be electrically coupled to a trace (not shown) on the PC board's 30 surface or coupled to internal traces or power/ground planes layered within the PC board 30. The traces on the PC board 30 may be coupled to a tester (not shown). Connected in this manner, a tester may be coupled to the pin assembly 22.

As stated above, the pin assembly 22, and therefore the enlarged sphere 38, is movable in response to a force applied to the pin assembly 22. Therefore, the enlarged sphere 38 may "scrub" the inner surface 44 of the via 45 in the PC board 30. This scrubbing action helps reduce the potential for high contact or inconsistent contact resistance due to possible contamination on the contacting surfaces, thus providing a longer lasting electrical interconnection.

The elastomer sheet 28 of the embodiment shown in FIG. 1 separates the housing 26 and the PC board 30. In addition, the elastomer sheet 28 may have a plurality of holes therethrough along the axis of the pin assemblies. Although this construction is simple, there may be concerns regarding thermal expansion. Typical temperature requirements for semiconductor devices range from −55 degrees C. to +125 degrees C. To ensure that a semiconductor device meet these requirements with proper design margins, manufacturers may test a semiconductor device from −65 degrees C. to +165 degrees C. Therefore it is recommended that the sheet of elastomer 28 be made of a material that has a coefficient of thermal expansion that is similar to the material used for the housing 26 and the PC board 30. It is further recommended that an embedded fiber be used to help control the thermal expansion rate of the elastomer sheet. It is contemplated that the elastomer sheet is only exemplary and that any resilient biasing means comprising an elastomer material may be used in the present invention.

The embodiment contained in FIG. 2 is similar to the embodiment described above. However, the elastomer sheet 28 is replaced by a cyndrical elastomer portion 46 around each pin assembly 22. In this embodiment, the housing 26, the cyndrical elastomer portion 46, and PC board 30 have a passthrough hole with a diameter extending therethrough along a common axis such that the pin assembly 22 may be received by the passthrough hole. The housing 26 may have a counter-bore hole 27A with a diameter equal to or larger than the diameter of the passthrough hole wherein the counter-bore hole 27A extends from a lower surface 40 of the housing 26 into the housing a predetermined distance. The predetermined distance may be sufficient to accommodate the shoulder 34 and the cyndrical elastomer portion 46. The diameter of the counter-bore hole 27A may be large enough to accommodate the shoulder 34 of the pin assembly 22. The diameter of the cyndrical elastomer portion may be smaller, equal, or greater than the shoulder 34. In this configuration, the shoulder 34 of the pin assembly 22 and the cyndrical elastomer portion 46 are secured within the contacting system via the housing 26 on the upper and side surfaces and by the PC board 30 on the lower surface. When a force is applied to the pin assembly 22 in a downward direction, the shoulder 34 produces a force on the cyndrical elastomer portion 46 thereby compressing the cyndrical elastomer portion 46. Therefore, the pin assembly 22 is movable in response to a force applied to the pin assembly 22. It is contemplated that the cyndrical elastomer portion 46 may be any shape and not limited to only a cyndrical shape. It is also contemplated that the elastomer element is only exemplary and that any resilient biasing means comprising an elastomer material may be used in the present invention.

The embodiment contained in FIG. 2 is not as susceptible to thermal expansion effects as the embodiment contained in FIG. 1. The cyndrical elastomer portion 46 may be made from materials that have a coefficient of thermal expansion that is substantially different than the materials of the housing 26 and the PC board 30. This allows the use of a broader class of materials, such as silicone rubber, in the cyndrical elastomer portion 46.

Figure 3:
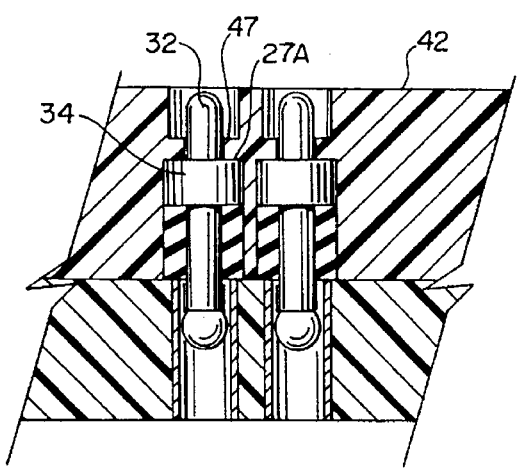
FIG. 3 is an enlarged fragmentary sectional view of a third embodiment of the present invention.

The embodiment contained in FIG. 3 is very similar to the embodiment contained in FIG. 2. The primary difference between these two embodiment is that in FIG. 3 the first contact element 32 does not extend past the upper surface 42 of the housing 26. Rather, a self alignment counterbore hole 47 may be provided from the upper surface 43 of the housing 26 for a predetermined depth. The predetermined depth of the self alignment counterbore hole 47 is set such that the self alignment counterbore hole 47 does not extend all the way to the counterbore hole 27A that receives the shoulder. That is, in the exemplary embodiment, there is a portion of the passthrough hole that remains between the counterbore hole 27A and the self alignment counterbore hole 47.

Figure 4:
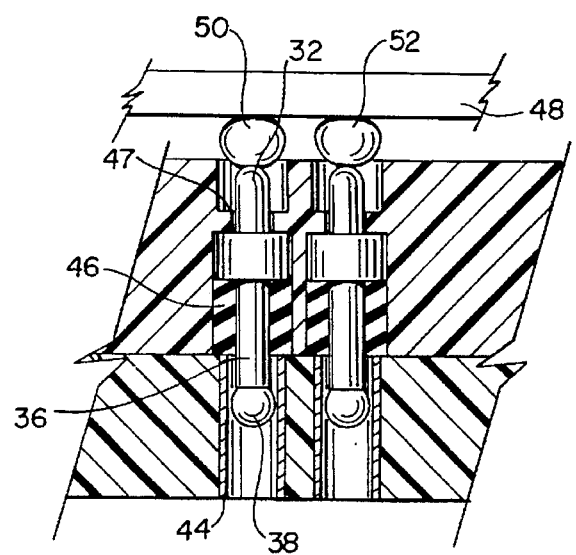
FIG. 4 is an enlarged fragmentary sectional view of the third embodiment of the present invention in contact with a semiconductor device having a ball grid array (BGA) package.

The self alignment counterbore hole 47 may be used to self align a semiconductor package lead with the first contacting element 32. Referring to FIG. 4, a Ball Grid Array (BGA) semiconductor package 48 having a solder ball contact 50 and a solder ball contact 52 may be placed in contact with the first contact element 32. The self alignment counterbore holes provide a mechanism for aligning the solder ball contact 50 with the corresponding first contact element 32. Consistent therewith, the self alignment counterbore hole 47 may have a diameter that is less than, equal to, or greater than the diameter of the solder ball contact 50.

As stated above, it is contemplated that a plurality of pin assembles may be used in the present invention. In addition, it is contemplated that the pin assemblies will be spatially positioned such that the each of the plurality of pin assemblies contact a corresponding solder ball contact 50 of the semiconductor package 48. Finally, it is contemplated that the present invention may work with any type of semiconductor package with any type of lead including the Ball Grid Array (BGA) package having solder ball contact leads and a Pin Grid Array (PGA) package having pin contact leads.

Figure 5:
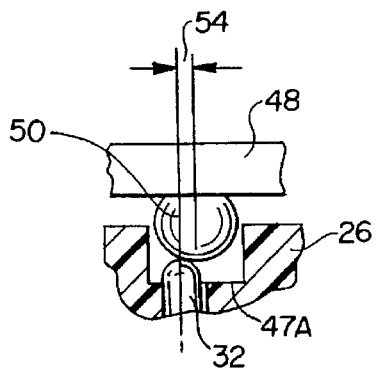
FIG. 5 is an enlarged fragmentary sectional view of the embodiment of FIG. 4 showing an enlarged view of the contact between the BGA package and the present invention.

Referring to FIG. 5, the ball contact 50 of the semiconductor package 48 may be offset from the center of the first contact element 32 by an offset distance 54. This configuration provides a lateral force on the first contact element 32. Referring to FIG. 1–4, the lateral force provided to the first contact element 32 is transmitted through the shoulder 34 and the second contact element 36 and finally to the enlarged sphere 38. Therefore, the enlarged sphere 38 is laterally forced against one side of the inner surface 44 of the via 45.

In a preferred embodiment of the present invention, only one side of the inner surface 44 of the via 45 is contacted by the enlarged sphere 38. This configuration reduces the friction between the inner surface 44 and the enlarged sphere 38 thereby allowing the pin assembly to more easily slide up and down within the via 45. In addition, the scrubbing action along the one side of the inner surface helps reduce the potential for high contact or inconsistent contact resistance due to possible contamination on the contacting surfaces, thus providing a longer lasting electrical interconnection.

In this embodiment, the self alignment counterbore 47A may be offset from the axis of the pin assembly 22 by the offset distance 54. This allows the solder ball contact 50 to be self aligned an offset distance 54 from the axis of the pin assembly 22.

Figure 6:
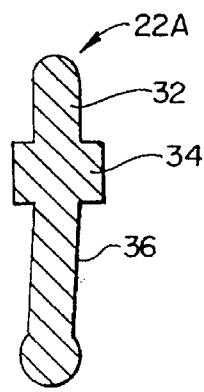
FIG. 6 is a sectional view of a single contact element and a fourth embodiment of the present invention.
Figure 7:
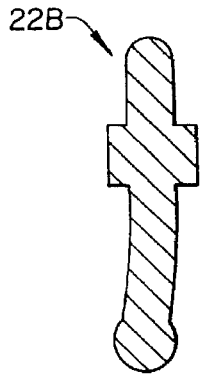
FIG. 7 is a sectional view of a single contact element and a fifth embodiment of the present invention.

Two other embodiments of the present invention which allow the enlarged sphere to contact one side of inner surface 44 are illustrated in FIGS. 6–7. Referring to FIG. 6, a pin assembly 22A may have the second contact element extending from the shoulder 34 at an angle from the general axis of the pin assembly 22A. This places the enlarged sphere 38 against only one side of inner surface 44 of the via 45. Referring to FIG. 7, the second contact element 36 may have a bend therein such that the enlarged sphere 38 is placed against only one side of inner surface 44 of the via 45. The embodiments contained in FIGS. 6–7 may be used with any of the embodiments shown in FIGS. 1–4. Consistent therewith, the through-hole in the elastomer element may be at an angle from the general axis of the pin assemblies 22A or 22B such that the second contact element 36 may slide more easily therein.

Figure 8:
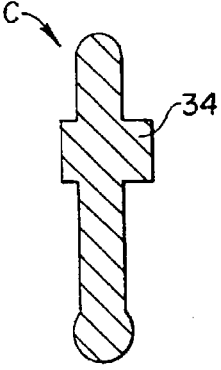
FIG. 8 is a sectional view of a single contact element and a sixth embodiment of the present invention.

In another embodiment of the present invention, the axis of the shoulder 34 may be offset from the axis of a pin assembly 22C as shown in FIG. 8. In this embodiment of the present invention, the shoulder 34 may extend a first distance from the pin assembly 22C on one side of the pin assemble 22C and a second distance from the pin assembly 22C on the other side of the pin assembly 22C. The first distance may be greater than the second distance. When force is applied to the first contact element 32 by a semiconductor package, more elastomer must be compressed by the side that has a shoulder extending a greater distance out therefrom. This causes the enlarged sphere 38 to be laterally forced against one side of the inner surface 44 of the via 45. The embodiment contained in FIG. 8 may also be used with any of the embodiments shown in FIGS. 1–4.

Figure 9:
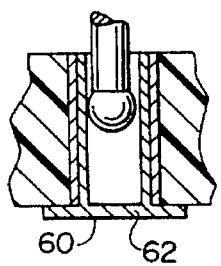
FIG. 9 is a sectional view of a single contact element and a seventh embodiment of the present invention.
Figure 11:
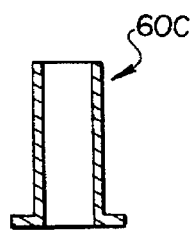
FIG. 11 is a sectional view of a via insert and a ninth embodiment of the present invention.

FIG. 9 and 11 illustrate another embodiment of the present invention. In FIG. 9 and 11, the second contact element 36 may be offset from the center axis of the via such that the enlarged sphere 38 touches only one side of the inner surface 44 of the via 45. In addition, there may be a via insert 60 that may be placed within the via 45 as shown. Via inserts 60 and 60C may have a hole therethrough generally concentric with the via 45. Consistent therewith, via inserts 60 and 60C generally have vertical walls that are substantially parallel to the axis of the pin assembly 22. The via insert 60 of FIG. 9 also has a bottom wall 62 enclosing the bottom of via 45. Via inserts 60 and 60C may be integrally formed with the PC board 30.

Figure 10:
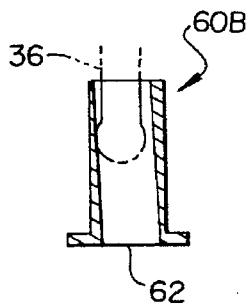
FIG. 10 is a sectional view of a via insert and an eighth embodiment of the present invention.

Another embodiment of the via insert is illustrated in FIG. 10. Referring to FIG. 10, via insert 60B may have a hole 62 therethrough wherein the hole 62 is set at an angle from the axis of the via insert 60B. In this embodiment, the second contact element 36 becomes more intensely engaged with one side of the inner surface of the via insert 60B as the second contact element 36 is depressed in a downward direction. Therefore, the further the second contact element 36 is depressed, the more force exists between the enlarged sphere 38 and the inner surface of the via insert 60B.

Figure 12:
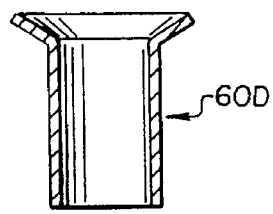
FIG. 12 is a sectional view of a via insert and a tenth embodiment of the present invention.
Figure 13:
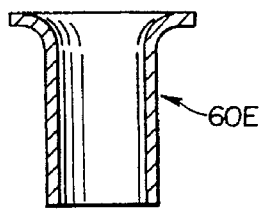
FIG. 13 is a sectional view of a via insert and an eleventh embodiment of the present invention.
Figure 14:
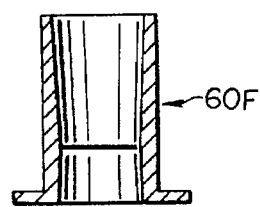
FIG. 14 is a sectional view of a via insert and a twelfth embodiment of the present invention.

FIGS. 12–14 illustrate various other embodiments of the via insert element. FIG. 12 shows a via insert 60D having a flanged top end. This embodiment allows the pin assembly 22 to be more easily inserted into the via insert 60D. Similarly, FIG. 13 shows a via insert 60E having a rolled over top end. This embodiment also allows the pin assembly 22 to be more easily inserted into the via insert 60E. Finally, FIG. 13 shows a via insert 60F having a taped inner surface. The top end of the via insert 60F has a larger opening for guiding the pin assembly 22 into the via insert 60F. The diameter of the opening in the via insert 60F gradually decreases such that at the bottom portion of the via insert 60F the diameter is just slightly larger than the diameter of the enlarged sphere 38.

Figure 15:
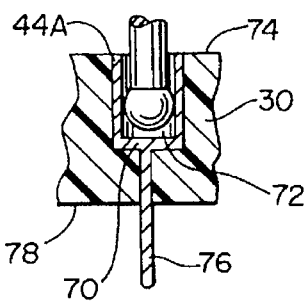
FIG. 15 is a sectional view of a test socket adapter assembly and thirteenth embodiment of the present invention.

Another embodiment of the present invention is shown in FIG. 15. Instead of having a hole extending through the entire PC board 30 for each pin assembly, a test socket adapter assembly 70 is installed in place thereof. The test socket adapter assembly comprises an opening 72 in the top surface 74 of the PC board 30. The opening 72 may have a depth such that the pin assembly 22 may have a full range of movement. However, the opening does not traverse through the entire width of the PC board 30. An inner surface of opening 72 may be coated with a conductive coating 44A and the conducting coating 44A may be coupled to a trace (not shown) on the PC board 30. A conductive element 76 may be coupled to the conductive coating 44A and may travel to the lower surface 78 of the PC board 30. An advantage of having the opening 72 in the PC board 30 rather than the via 45 is that the opening 72 frees up a number of routing layers in the PC board. This allows better decoupling between signals on the PC board and also allows more signals to be routed on the PC board. Another advantage is to allow an adapter board to transition between a P.C. Board 30 and a test socket. The adapter board may allow specific configurations of the high performance test apparatus to be attached to a standard P.C. board.

It is recognized that the present invention does not require a PC board. Rather, any means for connecting the pin assembly to a tester apparatus, such as a terminal, may be used and still be within the scope of the present invention.

Figure 16:
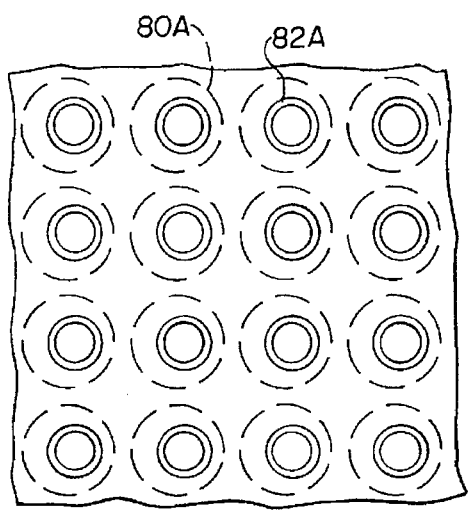
FIG. 16 is a fragmentary bottom plan view of a single bias array of contacts.

FIG. 16 is a fragmentary bottom plan view of an array of contact elements biased in a single direction. Referring to FIG. 5, the semiconductor package may be offset from the first contact element 32 by an offset distance 54. In addition, referring to FIG. 8, the shoulder 34 and the cyndrical elastomer may also be offset by an offset distance. Referring back to FIG. 16, the dashed circles 80A represent an array of cyndrical elastomer elements 46 while the solid concentric circles 82A represent a cross section of an array of the first contact elements 32. As can be seen from FIG. 16, the cyndrical elastomer elements 80A may be offset from the first contact elements 82A in one direction only. That is, each elastomer element may be offset a set direction and distance from its corresponding first contact element.

Figure 17:
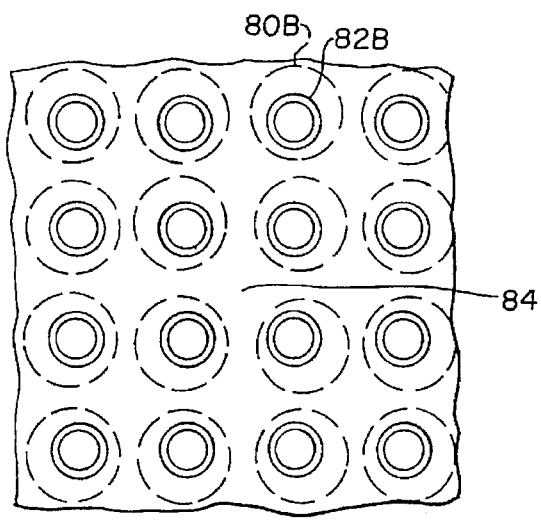
FIG. 17 is a fragmentary bottom plan view of a radial bias array of contacts.

FIG. 17 is a fragmentary bottom plan view of an array of contact elements biased in a radial direction. That is, the cyndrical elastomer elements 80B may be offset from the first contact elements 82B in a radial direction from point 84. That is, each elastomer element may be offset in a radial direction about a point 84 from its corresponding first contact element.

Figure 18:
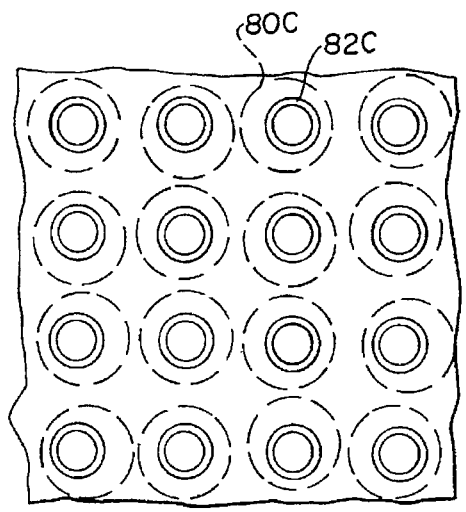
FIG. 18 is a fragmentary bottom plan view of a random bias array of contacts.

FIG. 18 is a fragmentary bottom plan view of an array of contact elements biased in a random direction. That is, the cyndrical elastomer elements 80C may be offset from the first contact elements 82C in a random direction. That is, each elastomer element may be offset in a random direction from its corresponding first contact element.

The above patterns and offset positions are only exemplary. It is recognized that other patterns and offset positions are within the scope of the present invention.

Figure 19:
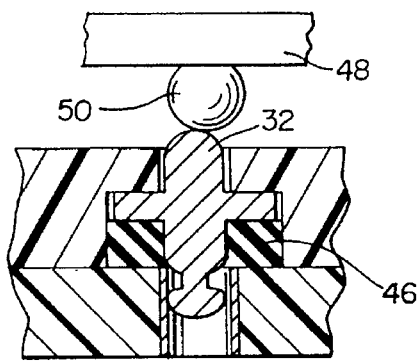
FIG. 19 is a fragmentary section of a fourteenth embodiment of the present invention.

FIG. 19 illustrates the embodiment of FIG. 2 having a Ball Grid Array (BGA) semiconductor package 48. The BGA semiconductor package 48 has at least one solder ball contact element 50. In a preferred mode of the present invention, the top end of the first contact element 32 is domed shaped when used in conjunction with a BGA semiconductor package 48.

Figure 20:
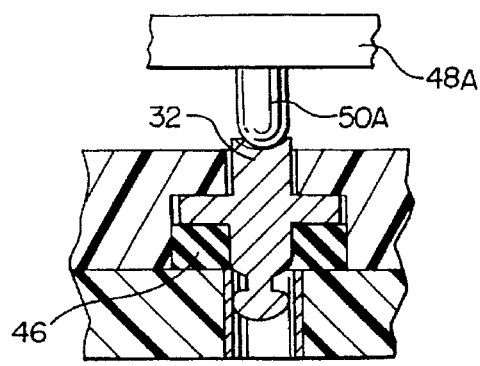
FIG. 20 is a fragmentary section of a fifteenth embodiment of the present invention interconnecting with a PGA device.

FIG. 20 illustrates the embodiment of FIGS. 2 having a Pin Grid Array (PGA) semiconductor package 48A. The PGA semiconductor package 48A has at least one pin contact element 50A. In a preferred mode of the present invention, the top end of the first contact element 32 is cup shaped when used in conjunction with a PGA semiconductor package 48A.

Figure 21:
FIG. 21 is a fragmentary detail section view showing a first alternative form of a contact tip.
Figure 22:
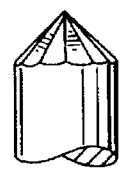
FIG. 22 is a fragmentary detail section view showing a second alternative form of a contact tip.
Figure 23:
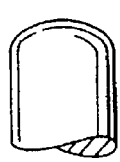
FIG. 23 is a fragmentary detail section view showing a third alternative form of a contact tip.
Figure 24:
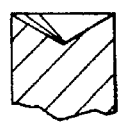
FIG. 24 is a fragmentary detail section view showing a fourth alternative form of a contact tip.
Figure 25:
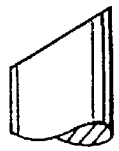
FIG. 25 is a fragmentary detail section view showing a fifth alternative form of a contact tip.

FIGS. 21–25 represent other embodiments of the top end of the first contact element 32. FIG. 21 shows a cupped shaped top end of the first contact element 32 for engaging a lead of a semiconductor package. FIG. 22 shows a pointed shaped top end of the first contact element 32 for engaging a lead of a semiconductor package. FIG. 23 shows a domed shaped top end of the first contact element 32 for engaging a lead of a semiconductor package. FIG. 24 shows a bevelled interior shaped top end of the first contact element 32 for engaging a lead of a semiconductor package. FIG. 25 showend angled top end of the first contact element 32 for engaging a lead of a semiconductor package. Finally, the above embodiment are only exemplary and it is recognized that any other shaped top end of the first contact element 32 is considered to be within the scope of the present invention, The performance of the present invention is exceptional. The present invention has a contact inductance of less than 2 nano-henries, a lead-to-lead capacitance of less than 1 pico-farad, a contact resistance of less than 10 mili-ohms, and an expected life of greater than 500,000 test cycles. In addition, the present invention has relatively few mechanical manufacturing limitations.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined in the language in which the appended claims are expressed.

What is claimed is:

1. Apparatus for electrically interconnecting a first terminal to a second terminal wherein the first terminal is spaced a distance from the second terminal, comprising:

(a) a conductive element having an upper end and a lower end, the conductive element comprising a first contact located at the upper end and a second contact located at the lower end, the first contact being electrically coupled to the first terminal and the second contact being electrically coupled to the second terminal when the first terminal is brought into engagement with the second terminal; and (b) means, comprising an elastomeric material, mounting the conductive element, for resiliently biasing the conductive element to an original position, the resilient biasing means being overcome when a force is applied to the conductive element, thereby allowing the conductive element to move in a direction against the bias of the biasing means in response to the force, the resilient biasing means returning the conductive element to the original position when the force is removed.

2. An apparatus according to claim 1 wherein the resilient biasing means comprises an elastomer sheet.

3. Apparatus according to claim 2 comprising a plurality of conductive elements, the elastomer sheet mounting the plurality of conductive elements.

4. An apparatus according to claim 1 wherein the resilient biasing means comprises an elastomer element carrying the conductive element.

5. An apparatus according to claim 4 wherein there are a plurality of conductive elements and a plurality of elastomer elements, each of the plurality of elastomer elements biasing a corresponding one of the plurality of conductive elements.

6. Apparatus for electrically interconnecting a lead of a device to a terminal spaced a distance from the lead, comprising:

(a) a conductive element comprising a first contact, a shoulder, and a second contact, the first contact being attached to the shoulder and extending upward therefrom, and the second contact being attached to the shoulder and extending downward therefrom, the first contact being electrically coupled to the lead of the device when the lead of the device is brought into engagement with the first contact and the second contact being electrically coupled to the terminal;

(b) a support member positioned below the shoulder of the conductive element; and (c) resilient biasing means comprising an elastomeric material positioned between the shoulder of the conductive element and the support member for resiliently biasing the conductive element in an original position, the resilient biasing means being overcome when a downward force is applied to the conductive element thereby allowing the conductive element to move in a downward direction in response to the downward force, the resilient biasing means returning the conductive element to the original position when the downward force is removed.

7. An apparatus according to claim 6 wherein the resilient biasing means comprises an elastomer sheet being positioned between the shoulder of the conductive element and the support member.

8. An apparatus according to claim 7 wherein there are a plurality of conductive elements each having a shoulder, the elastomer sheet being positioned between the shoulders of the plurality of conductive element and the support member.

9. An apparatus according to claim 6 wherein the resilient biasing means comprises an elastomer element being positioned between the shoulder of the conductive element and the support member.

10. An apparatus according to claim 9 wherein there are a plurality of conductive elements and a plurality of elastomer elements, each of the plurality of elastomer elements being positioned between the shoulder of a corresponding one of the plurality of conductive elements and the support member.

11. An apparatus according to claim 6 wherein the support member is a printed circuit board.

12. An apparatus according to claim 11 wherein the printed circuit board has a via therethrough for receiving the second contact of the conductive element.

13. An apparatus according to claim 12 wherein the via of the printed circuit board has an inner surface and the inner surface is coated with a conductive coating.

14. An apparatus according to claim 13 wherein the second contact is in physical contact with the inner surface of the via.

15. An apparatus according to claim 14 wherein the second contact is angled relative to the longitudinal axis of the conductive element such that the second contact only contacts one side of the inner surface of the via.

16. An apparatus according to claim 14 wherein the second contact is bent relative to the longitudinal axis of the conductive element such that the second contact only contacts one side of the inner surface of the via.

17. An apparatus according to claim 14 wherein the conductive element including the second contact is offset relative to the longitudinal axis of the via such that the second contact only contacts one side of the inner surface of the via.

18. An apparatus according to claim-14 further comprising a via insert.

19. An apparatus according to claim 18 wherein the via insert has a bore therethrough, the bore being angled relative to the longitudinal axis of the via such that the second contact only contacts one side of the inner surface of the via insert.

20. An apparatus according to claim 11 wherein the printed circuit board has a test socket adapter comprising a opening with a depth for receiving the second contact.

21. An apparatus according to claim 20 wherein the opening has an inner surface and the inner surface is coated with a conductive coating.

22. An apparatus according to claim 21 wherein the second contact is in physical contact with the inner surface of the opening.

23. Apparatus for electrically interconnecting a lead of a device to a terminal spaced a distance from the lead, comprising:
(a) a pin assembly comprising a first contact, a shoulder, and a second contact, the first contact being attached to the shoulder and extending upward therefrom, and the second contact being attached to the shoulder and extending downward therefrom, the first contact being electrically coupled to the lead of the device when the lead of the device is brought into engagement with the first contact and the second contact being electrically coupled to the terminal;
(b) a housing having an upper surface and a lower surface, the housing further having a first opening extending therethrough for receiving the first contact of the pin assembly and further having a counterbore extending from the lower surface of the housing for a predetermined depth for receiving the shoulder of the pin assembly;
(c) an elastomer sheet having an upper surface and a lower surface, the upper surface of the elastomer sheet extending along the lower surface of the housing, the elastomer sheet having an opening therethrough for receiving the second contact of the pin assembly; and
(d) a support member extending along the lower surface of the elastomer sheet, the support member being connected to the housing.

24. An apparatus according to claim 23 wherein there are a plurality of pin assemblies each having a shoulder, the elastomer sheet being positioned between the shoulders of the plurality of pin assemblies and the support member.

25. An apparatus according to claim 23 wherein the support member is a printed circuit board.

26. Apparatus for electrically interconnecting a lead of a device to a terminal spaced a distance from the lead, comprising:
(a) a pin assembly comprising a first contact, a shoulder, and a second contact, the first contact being attached to the shoulder and extending upward therefrom, and the second contact being attached to the shoulder and extending downward therefrom, the first contact being electrically coupled to the lead of the device when the lead of the device is brought into engagement with the first contact and the second contact being electrically coupled to the terminal;
(b) an elastomer element having an opening therethrough for receiving the second contact of the pin assembly;
(c) a housing having an upper surface and a lower surface, the housing further having a first opening extending therethrough for receiving the first contact of the pin assembly and further having a counterbore extending from the lower surface of the housing for a predetermined depth for receiving the shoulder of the pin assembly and the elastomer element; and
(d) a support member extending along the lower surface of the housing, the support member being connected to the housing.

27. An apparatus according to claim 26 wherein there are a plurality of conductive elements and a plurality of elastomer elements, each of the plurality of elastomer elements being positioned between the shoulder of a corresponding one of the plurality of conductive elements and the support member.

28. An apparatus according to claim 27 wherein the plurality of elastomer elements are offset from a corresponding one of the plurality of pin assemblies in a predetermined direction.

29. An apparatus according to claim 27 wherein the plurality of elastomer elements are offset from a corresponding one of the plurality of pin assemblies in a radial direction relative to a predetermined point.

30. An apparatus according to claim 27 wherein the plurality of elastomer elements are offset from a corresponding one of the plurality of pin assemblies in a random direction.

31. An apparatus according to claim 26 wherein the housing further comprises a self alignment counter-bore extending from the upper surface of the housing and having a depth, the self alignment counter-bore being generally concentric with the first opening in the housing.

32. An apparatus according to claim 31 wherein the self alignment counter-bore is offset from the first opening in the housing.

33. An apparatus according to claim 26 wherein the support member is a printed circuit board.

34. An apparatus according to claim 33 wherein the printed circuit board has a via therethrough for receiving the second contact of the conductive element.

35. An apparatus according to claim 34 wherein the via of the printed circuit board has an inner surface and the inner surface is coated with a conductive coating.

36. An apparatus according to claim 35 wherein the second contact is in physical contact with the inner surface of the via.

37. An apparatus according to claim 36 wherein the second contact only contacts one side of the inner surface of the via.

38. An apparatus according to claim 26 wherein an upper end of the first contact comprises a dome shape for engaging the lead of the device.

39. An apparatus according to claim 26 wherein an upper end of the first contact comprises a cup shape for engaging the lead of the device.

40. An apparatus according to claim 26 wherein an upper end of the first contact comprises a point shape for engaging the lead of the device.

41. Apparatus for electrically interconnecting a first terminal to a second terminal wherein the first terminal is spaced a distance from the second terminal, comprising:
  (a) a conductive element having an upper end and a lower end, the conductive element comprising a first contact located at the upper end and a second contact located at the lower end, the first contact being electrically connectable to the first terminal; and
  (b) means, comprising an elastomeric element, mounting the conductive element, for resiliently biasing the conductive element to an original orientation, the resilient biasing means being overcome when a force is applied to the conductive element, wherein the conductive element moves against the bias of the biasing means in response to the force, the first terminal being offset from said first contact when it is electronically connected thereto, wherein said conductive element tilts at an angle relative to an axis that is generally coaxial with the original orientation of the conductive element, and thus causing the second contact to press against said second terminal, the resilient biasing means returning the conductive element to substantially the original orientation when the force is removed.

42. Apparatus according to claim 41 wherein said second terminal comprises a via insert, said via insert having a cavity therein for receiving said second contact of said conductive element, said cavity having an inner wall that extends at an angle relative to said axis such that said second contact more intensely presses against said inner wall as said resilient biasing means allows said conductive element to move in response to said force.

43. Apparatus according to claim 41 wherein said conductive element further comprises a flange, said first contact being attached to said flange and extending upward therefrom, and said second contact being attached to said flange and extending downward therefrom, said apparatus further comprising a via insert positioned below the flange of the conductive element, wherein said via insert has a bore-hole therethrough for receiving said second contact, an inner surface of said bore-hole comprising said second terminal, said resilient biasing means being positioned between said flange of said conductive element and said via insert.

* * * * *